United States Patent [19]

Butler

[11] Patent Number: 4,686,745
[45] Date of Patent: Aug. 18, 1987

[54] COUPLER AND PROTECTOR DEVICE FOR TWO REMOTE CONTROL UNITS

[76] Inventor: Lorraine M. Butler, 86-69 Springfield Blvd., Queens Village, N.Y. 11427

[21] Appl. No.: 890,505

[22] Filed: Jul. 30, 1986

[51] Int. Cl.⁴ .............................................. B65D 67/02
[52] U.S. Cl. ..................................... 24/17 B; 24/183; 24/336; 206/805
[58] Field of Search ................ 24/17 B, 17 R, 17 AP, 24/3 A, 3 F, 10 A, 304, 335, 336, 67.11, 129 D, 183, 197, 198, 199, 200, 453, 543; 206/805, 387, 821; 156/55; 211/60.1

[56] References Cited

U.S. PATENT DOCUMENTS

| | | | |
|---|---|---|---|
| 711,798 | 10/1902 | Taylor | 24/200 |
| 913,962 | 3/1909 | Liddy | 24/17 AP |
| 1,661,821 | 3/1928 | Hagelin | 24/183 |
| 1,687,370 | 10/1928 | La Vigne | 24/198 |
| 2,257,559 | 9/1941 | Albertson | 24/129 D |
| 3,702,132 | 11/1972 | Fites et al. | 206/387 |
| 3,872,538 | 3/1975 | Crouser | 24/543 |
| 3,930,578 | 1/1976 | Stein | 206/805 |
| 4,610,362 | 9/1986 | Remp et al. | 211/60.1 |

FOREIGN PATENT DOCUMENTS

| | | | |
|---|---|---|---|
| 1132912 | 3/1957 | France | 206/805 |
| 1176805 | 1/1970 | United Kingdom | 24/336 |

*Primary Examiner*—Victor N. Sakran
*Attorney, Agent, or Firm*—Michael I. Kroll

[57] ABSTRACT

A coupler and protector device for two remote control units is provided and consists of a pair of elastic straps which will hold the two remote control units together in a back to back relationship so that a person can use both units at the same time. The elastic straps will prevent damage to the units by absorbing shock thereto if dropped or hit against any hard surface.

7 Claims, 7 Drawing Figures

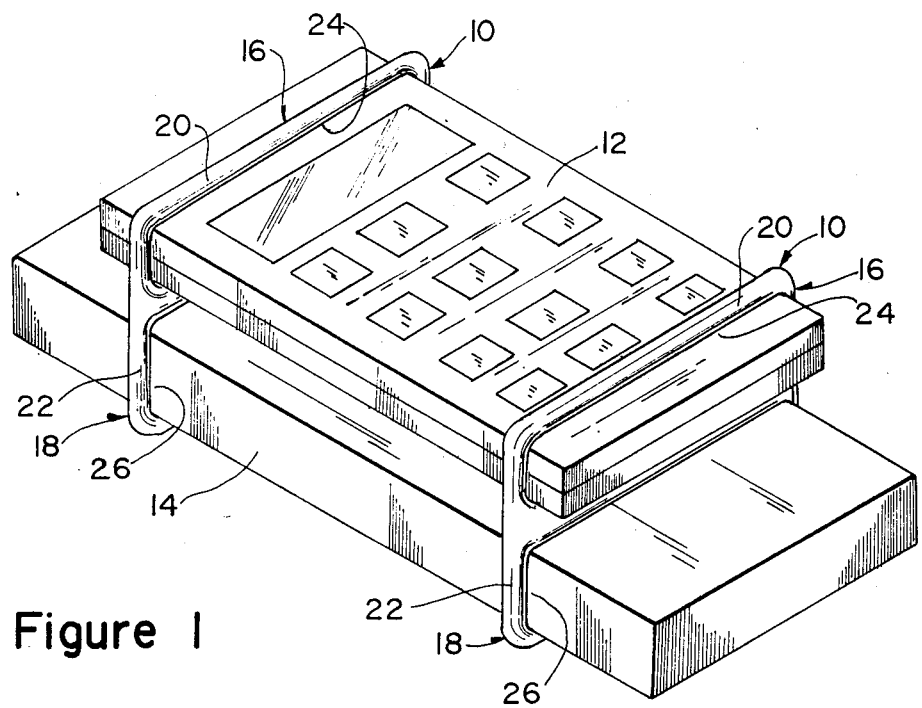
Figure 1
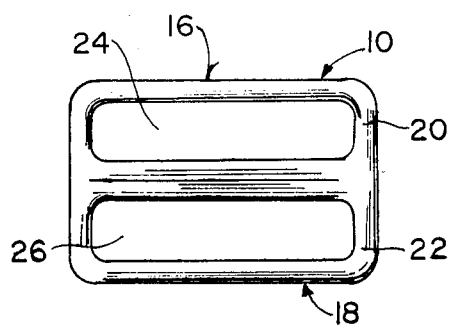
Figure 2
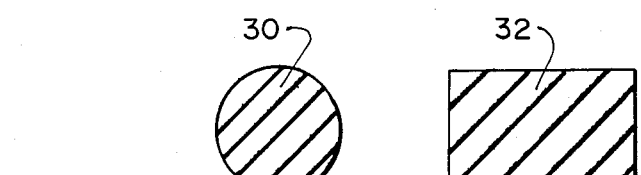
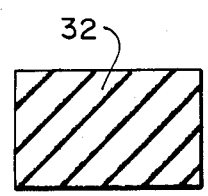
Figure 4A   Figure 5A
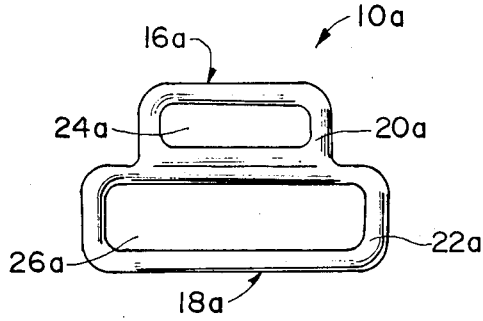
Figure 3
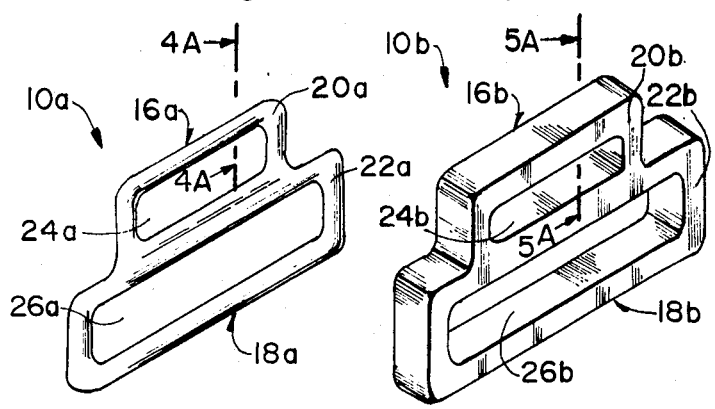
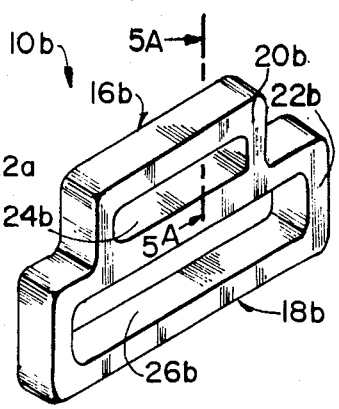
Figure 4   Figure 5

COUPLER AND PROTECTOR DEVICE FOR TWO REMOTE CONTROL UNITS

BACKGROUND OF THE INVENTION

1. Field of the Invention

The instant invention relates generally to remote control units and more specifically it relates to a coupler and protector device for two remote control units.

2. Description of the Prior Art

Numerous remote control units have been provided in prior art that are adapted to operate television sets, video cassette recorders, radios, stereo components and the like. The problem is that it is difficult to combine any two size remote control units which are normally used separately so that they can be handled together for convenience by a person when using both remote control units in conjunction with each other.

SUMMARY OF THE INVENTION

A primary object of the present invention is to provide a coupler and protector device for two remote control units that will overcome the shortcomings of the prior art devices.

Another object is to provide a coupler and protector device for two remote control units that will hold the two remote control units together in a back to back relationship so that a person can use both units at the same time.

An additional object is to provide a coupler and protector device for two remote control units that will prevent damage to the units if dropped or hit against any hard surface by absorbing shock thereto.

A further object is to provide a coupler and protector device for two remote control units that is simple and easy to use.

A still further object is to provide a coupler and protector device for two remote control units that is economical in cost to manufacture.

Further objects of the invention will appear as the description proceeds.

To the accomplishment of the above and related objects, this invention may be embodied in the form illustrated in the accompanying drawings, attention being called to the fact, however, that the drawings are illustrative only, and that changes may be made in the specific construction illustrated and described within the scope of the appended claims.

BRIEF DESCRIPTION OF THE DRAWING FIGURES

FIG. 1 is a perspective view of the invention engaging two remote control units.

FIG. 2 is a front view of one of the elastic strap units.

FIG. 3 is a front view of a modification.

FIG. 4 is a perspective view thereof.

FIG. 4A is an enlarged cross sectional view taken along line 4A—4A in FIG. 4.

FIG. 5 is a perspective view of another modification.

FIG. 5A is an enlarged cross sectional view taken along line 5A—5A in FIG. 5.

DETAILED DESCRIPTION OF THE PREFERRED EMBODIMENTS

Turning now descriptively to the drawings, in which similar reference characters denote similar elements throughout the several views, FIGS. 1 illustrates a coupler and protector device 9 for two remote control units 12 and 14. The device 9 consists of a pair of elastic straps 10. As best seen in FIG. 2, each strap 10 includes an upper portion 16 and a lower portion 18 attached thereto at 28.

The upper portion 16 is a first rectangular frame 20 that has a first aperture 24. The lower portion 18 is a second rectangular frame 22 that has a second aperture 26. One of the two remote control units 12 can be inserted through the first aperture 24 of each of the elastic straps 10, while other of the two remote control units 14 can be inserted through the second aperture 26 of each of the elastic straps 10 in a back to back relationship allowing a person (not shown) to use both units at the same time.

Each of the elastic straps 10 is fabricated out of rubber which will prevent damage to the remote control units 12 and 14 by absorbing shock thereto if dropped and hit against any hard surface. The first and second apertures 24 and 26 of each of the elastic straps 10 are of a same size for same size remote control units 12 and 14.

FIGS. 3 and 4 show a modified elastic strap 10a wherein the first and second apertures 24a and 26a are of a different size for different size remote control units 12 and 14. As best seen in FIG. 4A the cross section of the first frame 20a of the upper portion 16a and the cross section of the second frame 22a of the lower portion 18a of each of the elastic straps 10a is circular as indicated by 30. The cross section of the first frame 20 and second frame 22 of each of the elastic straps 10 in FIGS. 1 and 2 are also circular.

FIG. 5 shows another modified elastic strap 10b wherein the first and second apertures 24b and 26b are also of a different size for different size remote control units 12 and 14. As best seen in FIG. 5A the cross section of the first frame 20b of the upper portion 16b and the cross section of the second frame 22b of the lower portion 18b of each of the elastic straps 10b is rectangular as indicated by 32. The cross section of the first frame 20 and second frame 22 of each of the elastic straps 10 can also be rectangular if so desired.

Since the straps of FIGS. 2 and 3 are elastic the aperatures they define in FIG. 2 may take the unequal form of FIG. 3 and similarly the unequal aperatures of FIG. 3 may finally take the shape of FIG. 2, said aformentioned size changes depending upon the size of the remote control units that are inserted in said aperatures.

While certain novel features of this invention have been shown and described and are pointed out in the annexed claims, it will be understood that various ommissions, substitutions and changes in the forms and details of the device illustrated and in its operation can be made by those skilled in the art without departing from the spirit and scope of the within invention.

What is claimed is:

1. A coupler and protective device to be used by a person for two remote control units having backs, comprising: a pair of separate linearly thin one piece elastic readily laterally deformable upon application substantially square straps, each strap of said pair of straps including an upper portion and a lower portion attached thereto and being coplanar and having a separating partition, said upper portion being a first rectangular frame having a first aperture and a top edge and being separated by said partition from said lower portion being a second rectangular frame having a second aperture and a bottom edge so that one of the two remote control units can be inserted through said first aperture of each of said elastic straps while other of said two remote control units can be inserted through said second aperture of each of said elastic straps in the back to back relationship allowing the person to use both units at the same time, each of said first and second rectangular frames having a first position and a second position, said top edge and said partition and said bottom edge remaining same length and substantially square during said lateral deformation of said first position while said top edge and said partition and said bottom edge becoming different lengths during said lateral deformation of said second position.

2. A coupler and protector device for two remote control units as recited in claim 1, wherein each of said elastic straps is fabricated out of rubber which will prevent damage to said remote control units by absorbing shock thereto if dropped and hit against any hard surface.

3. A coupler and protector device for two remote control units as recited in claim 2, wherein said first and second apertures of each of said elastic straps are of a same size for same size remote control units.

4. A coupler and protector device for two remote control units as recited in claim 2, wherein said first and second apertures of each of said elastic straps are of a different size for different size remote control units.

5. A coupler and protector device for two remote control units as recited in claim 2, wherein said cross section of said first frame of said upper portion and cross section of said second frame of said lower portion of each of said elastic straps is circular.

6. A coupler and protector device for two remote control units as recited in claim 2, wherein said cross section of said first frame of said upper portion and cross section of said second frame of said lower portion of each of said elastic straps is rectangular.

7. A coupler and protector device for two remote control units as recited in claim 2, wherein the apertures may change in size depending upon the size of the remote unit that is inserted therein.

* * * * *